United States Patent [19]
Norman

[11] Patent Number: 5,859,544
[45] Date of Patent: Jan. 12, 1999

[54] DYNAMIC CONFIGURABLE ELEMENTS FOR PROGRAMMABLE LOGIC DEVICES

[75] Inventor: Kevin Alan Norman, Belmont, Calif.

[73] Assignee: Altera Corporation, San Jose, Calif.

[21] Appl. No.: 716,789

[22] Filed: Sep. 5, 1996

[51] Int. Cl.[6] .................................................. H03K 7/38
[52] U.S. Cl. ............................................. 326/40; 326/38
[58] Field of Search .................... 328/38, 39, 40, 328/46

[56] References Cited

U.S. PATENT DOCUMENTS

| | | |
|---|---|---|
| 4,546,273 | 10/1985 | Osman . |
| 4,717,912 | 1/1988 | Harvey et al. . |
| 5,317,212 | 5/1994 | Wahlstrom . |
| 5,396,452 | 3/1995 | Wahlstrom . |
| 5,423,388 | 6/1995 | Crafts et al. ............................. 326/40 |
| 5,581,198 | 12/1996 | Trimberger ............................. 326/39 |
| 5,640,106 | 6/1997 | Erickson et al. ....................... 326/40 |
| 5,640,107 | 6/1997 | Kruse ..................................... 326/38 |

Primary Examiner—Michael J. Tokar
Assistant Examiner—Richard Roseen
Attorney, Agent, or Firm—Townsend and Townsend and Crew LLP

[57] ABSTRACT

A programmable logic device using dynamic programmable elements to store configuration data is refreshed by periodic writing of configuration data from the source memory into the dynamic programmable elements. The invention takes advantage of smaller sized dynamic programmable elements and eliminates the need to perform tedious read/sense operation for each refresh cycle.

7 Claims, 5 Drawing Sheets

DYNAMIC CONFIGURABLE ELEMENTS FOR PROGRAMMABLE LOGIC DEVICES

BACKGROUND OF THE INVENTION

The present invention relates in general to programmable logic devices (PLDs), and in particular to dynamic configurable elements for PLDs.

Programmable logic devices are circuits that include a large number of logic gates whose logic function and interconnection can be programmed via programmable elements to form a desired logic function. Programmability is achieved using any one of a variety of programmable technologies, such as fusible links, erasable programmable read only memory (EPROM), electrically erasable programmable read only memory (EEPROM), and flash EEPROM. A fuse element is typically a small value resistor as fabricated which is selectively transformed into an open circuit upon programming. EPROM technology uses a transistor that has low turn on voltage upon fabrication, and is selectively transformed into an open circuit by raising the turn on voltage higher than the power supply during programming. EEPROM technology produces a high turn on voltage transistor after bulk erasure, and selectively transforms the transistor into a depletion mode device by electrically reducing the turn on voltage to below zero volts.

All of the above-mentioned programmable technologies fall in the non-volatile category. That is, when the power is removed from the circuit momentarily, these programmable elements retain the programmed information. It is therefore only necessary to load the programming information into the part once. For the fuse based PLD, it is impossible to reverse the programming (or patterning) step. For the EPROM based PLD about half an hour of exposure to ultra violet radiation is required to deprogram the device. For the EEPROM and flash EEPROM based PLD, the programmable element may be reset to its initial state using less than a few minutes of electrical stress.

Another type of programmable element used in PLDs is the static random access memory (SRAM) cell. An SRAM cell operates as a bistable latch. FIG. 1 shows an SRAM cell 100 having an access transistor 102 and a pair of back-to-back connected inverters 104 that acts as a latch. The cell 100 drives the gate terminal of a pass transistor 106 that forms part of the programmable logic gate. The SRAM cell does not retain its contents when power is removed. For this reason an external source of programming (or configuration) data must be provided along with an SRAM based PLD for reconfiguring the PLD in case of a momentary power failure. Once the PLD is reconfigured upon power up, however, the source of configuration data is idle and serves no purpose during the operation of the PLD.

There are advantages and disadvantages associated with both the volatile and the non-volatile programmable technologies. The programmable element in the non-volatile technologies tend to be smaller in size which enhance the logic density of a PLD. However, PLDs using any one of the non-volatile programmable technologies require special fabrication steps which increase the cost of manufacture and reduce the number of qualified sources of manufactured silicon wafer. The SRAM based PLDs on the other hand may be fabricated on, for example, a standard complementary metal-oxide-semiconductor (CMOS) process or a process tuned for CMOS logic and SRAM circuits. The cost of manufactured wafers is thus lower for the SRAM based PLDs with many more qualified sources of manufactured wafers. As can be seen by the required circuitry in FIG. 1, the SRAM cell however is considerably larger than its non-volatile counterparts. With today's technologies, a typical SRAM cell may be twice as large as an EEPROM cell and ten times the size of an EPROM or flash EEPROM cell.

An approach for a PLD design that retains the low cost and manufacturability of SRAM based PLDs while reducing the size of the programmable element is offered by Wahlstrom in U.S. Pat. No. 5,317,212. Wahlstrom teaches using a dynamic random access memory (DRAM) cell as the programmable element in a PLD instead of an SRAM cell. The DRAM cell can be fabricated using standard CMOS technology, and typically includes a small storage capacitor coupled to a single small access transistor which results in a much smaller cell.

Because DRAM cells dynamically store the configuration data on leaky storage capacitors, the cells require periodic refreshing. A typical DRAM refresh cycle includes the steps of addressing the cells, sensing their contents (i.e. logic high or logic low), and writing the information back in the cells. Thus, to refresh DRAM cells, the circuit must perform a read operation before writing back. This requires additional circuitry, such as sense amplifiers. Also, because a read operation disturbs the amount of charge stored on the cell capacitor, the operation of the PLD must be synchronized to avoid reading of the cells during refresh. This requires more circuitry and tends to limit the operating speed of the circuit. Wahlstrom offers various embodiments to allow the PLD to rely on the DRAM cell voltage even during a refresh cycle. However, the various embodiments of the proposed DRAM cell either require larger storage capacitors or additional circuit elements that result in an overall larger programmable cell. There is therefore room for further improvements in the design of smaller and more cost effective programmable elements for PLDs.

SUMMARY OF THE INVENTION

The present invention provides a smaller and lower cost programmable element for use in programmable logic devices. The programmable element is based on dynamic charge storage which results in very small cell size and retains low cost manufacturability. Instead of performing a conventional refresh cycle which includes tedious sensing procedures and adds to circuit complexity, the present invention provides a method for reusing the initial source of configuration data to periodically refresh the dynamic programmable elements. This eliminates the requirement of performing a read operation and leaves the charge stored in the dynamic programmable cell undisturbed.

Accordingly, in one embodiment, the present invention offers a method for operating a programmable logic device (PLD) including the steps of: (a) providing a source of configuration data external to the PLD; (b) using a plurality of dynamic programmable elements to store the configuration data on the PLD; (c) providing an interface between the source of configuration data and the PLD; and (d) refreshing the plurality of dynamic programmable elements by periodically rewriting the configuration data from the source into the PLD.

In another embodiment, the present invention provides a programmable logic system including a source memory circuit for storing configuration data, a programmable logic device (PLD) having a plurality of dynamic programmable elements coupled to a plurality of logic elements, and an interface circuit connecting the source memory circuit to the PLD, wherein, the plurality of dynamic programmable elements in the PLD are refreshed by periodically rewriting the configuration data from the source memory circuit into the PLD via the interface circuit.

A better understanding of the nature and advantages of the programmable logic system of the present invention may be had with reference to the drawings and detailed description below.

DESCRIPTION OF SPECIFIC EMBODIMENTS

Figure 1:
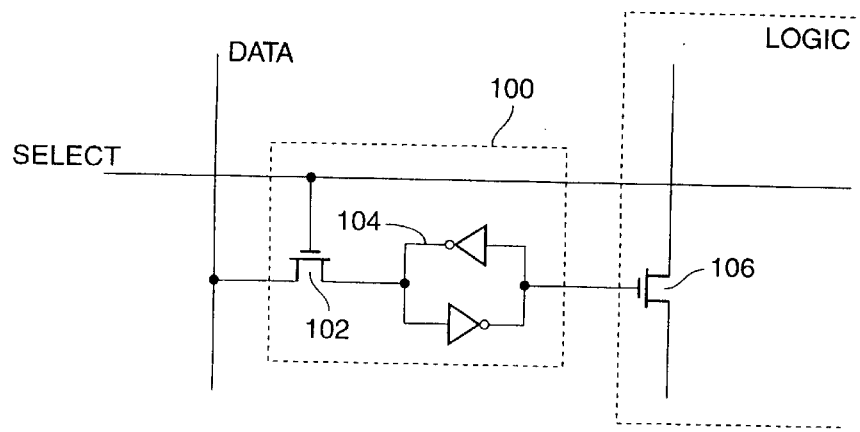
FIG. 1 is a simplified schematic showing the prior art use of an SRAM cell as configuration bit in a PLD.
Figure 2:
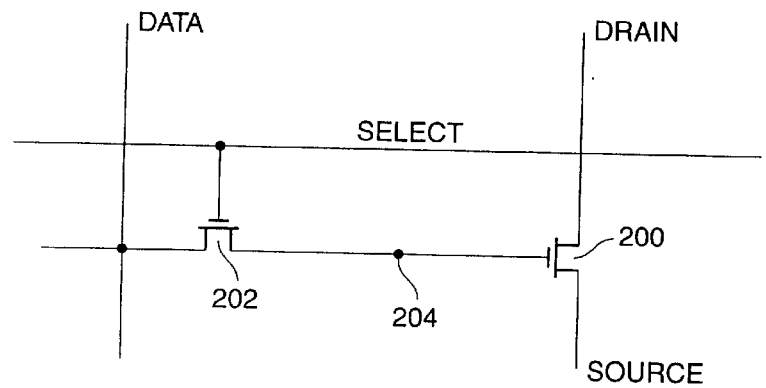
FIG. 2 shows an exemplary embodiment of a configuration bit for a dynamic PLD according to the present invention.

In place of non-volatile or SRAM cells that are conventionally used as configuration bits to control each of the programmable elements in a PLD, the present invention uses the charge stored on the gate oxide capacitor of an MOS pass transistor or the gate oxides of an input to an integrated CMOS logic gate. Referring to FIG. 2 there is shown an exemplary embodiment of a dynamic configuration bit using the gate oxide of a pass transistor 200 as the storage capacitor. An access transistor 202 with its drain terminal connected to a data line, gate terminal connected to a select line and source terminal connected to the storage node 204, provides access to the storage node 204 when turned on. When programmed to store positive charge equivalent to a logic high, pass transistor 200 is rendered conductive and its source and drain terminals are shorted together. When storing zero charge, transistor 200 is off causing an open circuit between its source and drain terminals.

Figure 3:
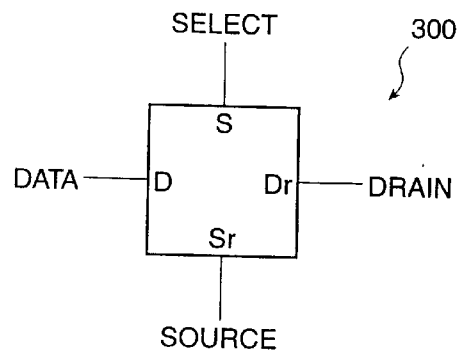
FIGS. 3 shows a symbol for the cell of FIG. 2.
Figure 4:
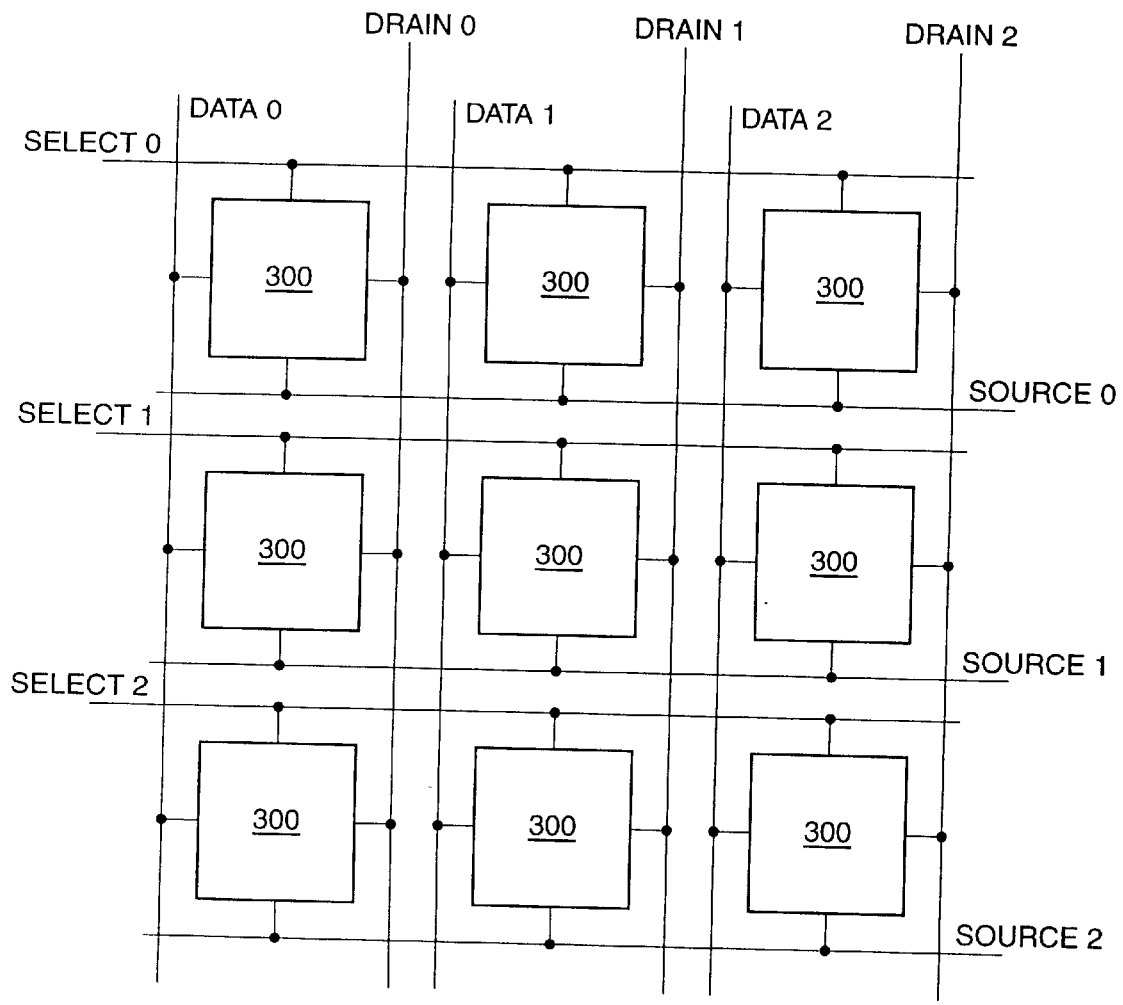
FIG. 4 shows the interconnection for an array of dynamic configuration cells.

FIG. 3 shows a symbol 300 for the exemplary dynamic configuration bit of FIG. 2 having data, select, source and drain terminals. The dynamic PLD includes a large number of data lines that run in parallel with each other and perpendicular to a large number of select lines. The collection of all of the programmable elements 300 are distributed at the intersection of the grid formed by the data and select lines. Such an array is shown in FIG. 4. The storage capacitors are programmed in parallel when the desired state of a row of configuration bits is placed on the collection of vertical data lines and the particular select line for the given row of configuration bits is pulsed high and then returned low. This is repeated for each select line until all of the configuration storage capacitors have been programmed. Further details of programming and refreshing mechanism will be discussed hereinafter.

An important aspect of a dynamic PLD is the provision for the refresh mechanism. Referring back to the dynamic configuration cell of FIG. 2, it can be seen that any charge stored on the gate oxide of pass transistor 200 will over time leak and eventually discharge to a level below the recognizable logic threshold levels. The contents of the cell must therefore be refreshed periodically (e.g., every 10 msec.) for proper operation of the device. Instead of the conventional refresh cycle which includes tedious sensing procedures and adds to circuit complexity, the present invention uses the initial source of configuration data to periodically rewrite the same configuration data back into the dynamic programmable elements. The refresh mechanism thus involves nothing more than a repeated loading of the configuration data into the dynamic PLD. This eliminates the requirement of performing a read operation and leaves the charge stored in the dynamic programmable cell undisturbed.

Figure 5:
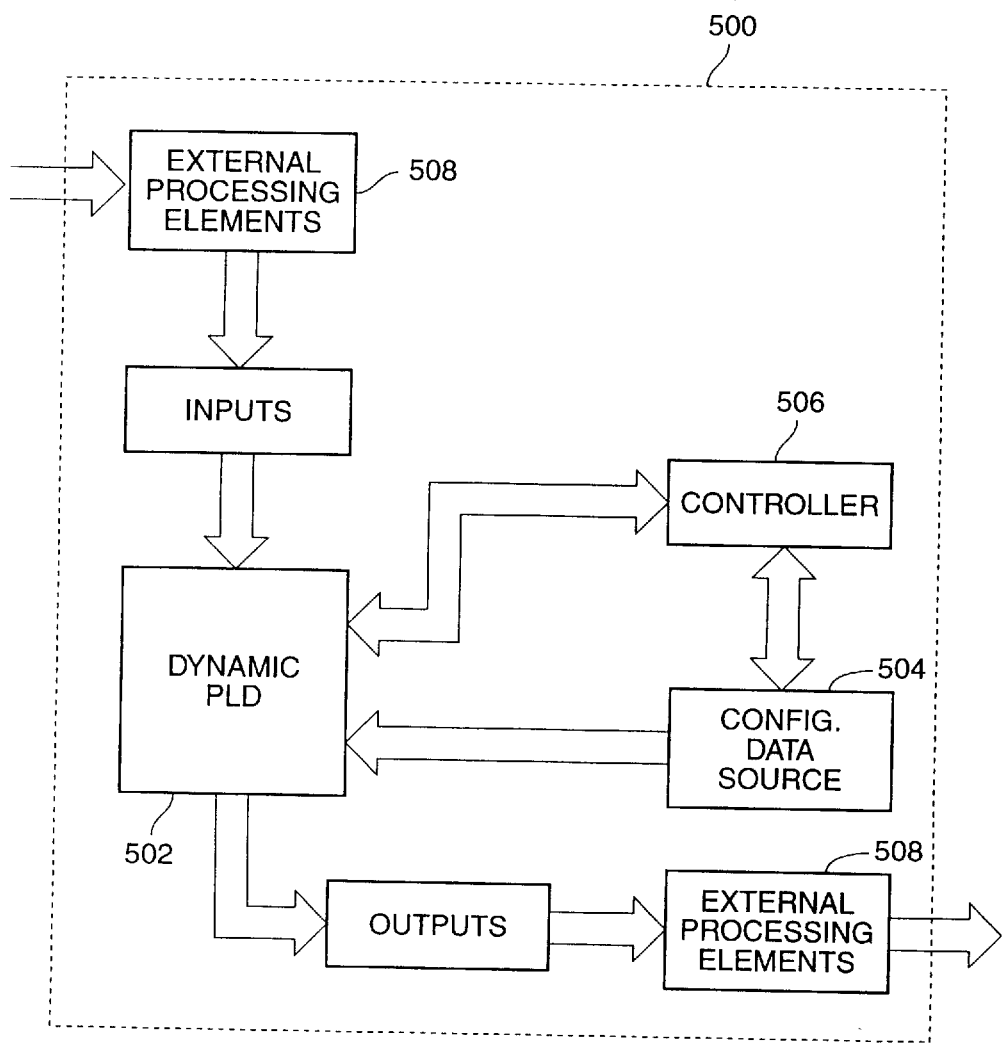
FIG. 5 is a block diagram of a programmable logic system using dynamic storage elements according to the present invention.

FIG. 5 is a block diagram of a programmable logic system 500 using dynamic storage elements according to the present invention. The system 500 includes a dynamic PLD 502 that connects to a configuration data source 504 and a controller 506. External processing elements 508 and 510 process the system inputs and outputs, respectively. The controller 506 monitors the configuration data source 504 continuously, and causes a periodic transfer of configuration data from the source 504 to the dynamic PLD 502. There is no need to sense and read the contents of the dynamic configuration bits inside the dynamic PLD 502 since the same configuration data that was used to originally program the dynamic cells is being used again to write into the cells.

Figure 6A:
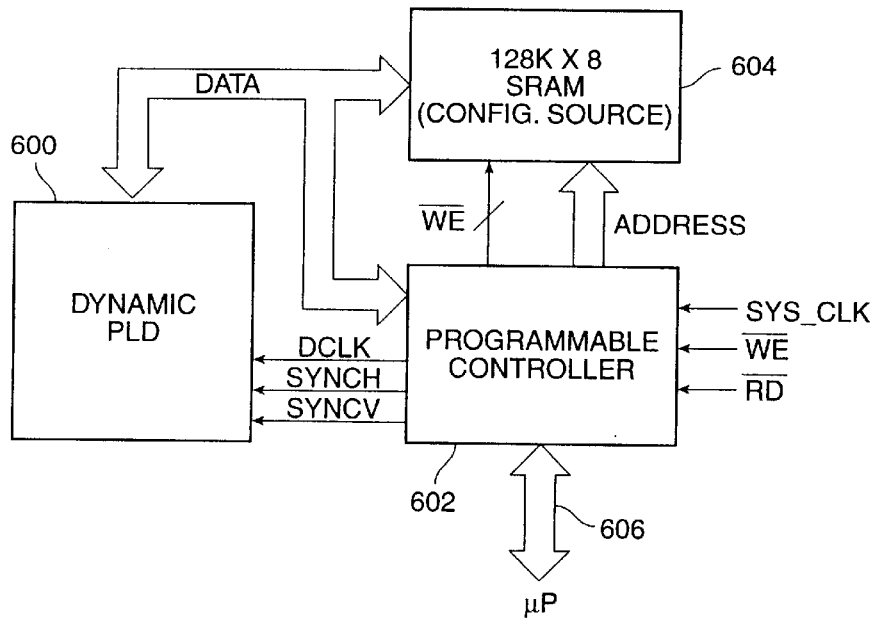
FIGS. 6A and 6B are exemplary embodiments for the programmable logic system of the present invention using two different types of memories as sources of configuration data.

FIG. 6A shows one exemplary embodiment of a dynamic PLD using an SRAM as the configuration data source. A general purpose PLD can be used to implement a programmable controller 602 that controls the down loading of data into the SRAM device 604 as well as the programming of the dynamic PLD 600. The programmable controller 602 connects to an external source (e.g., disk) via a microprocessor bus 606, and receives other system signals such as system clock, WE and RD signals for down loading of the configuration data. Using the down loaded configuration data, the programmable controller 602 programs the SRAM 604 via address and data buses 608 and 610. The programmable controller 602 also provides data clock (DCLK) and horizontal and vertical synch. signals SYNCH and SYNCV that control the timing of programming as well as refreshing. The device and bus sizes are provided as exemplary values for this specific embodiment.

Figure 6B:
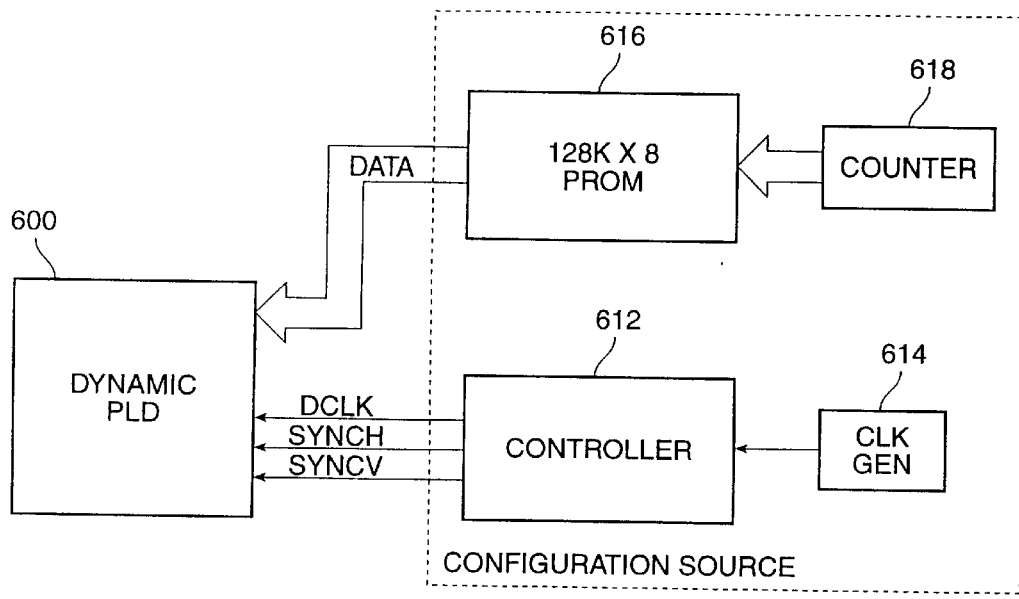

FIG. 6B shows another exemplary embodiment of a dynamic PLD using a serial EPROM as the configuration source. In this embodiment, both the controller 612 and the PROM 616 are implemented by a single special purpose PLD such as the Altera EPC1064. Once the PROM 616 is programmed with the configuration data, a counter 618 is prompted by the controller 612 to cause a steady stream of configuration data to be written into the dynamic PLD 600. The controller 612 also supplies the timing data (DCLK, SYNCH, and SYNCV) to the dynamic PLD 600.

Figure 7:
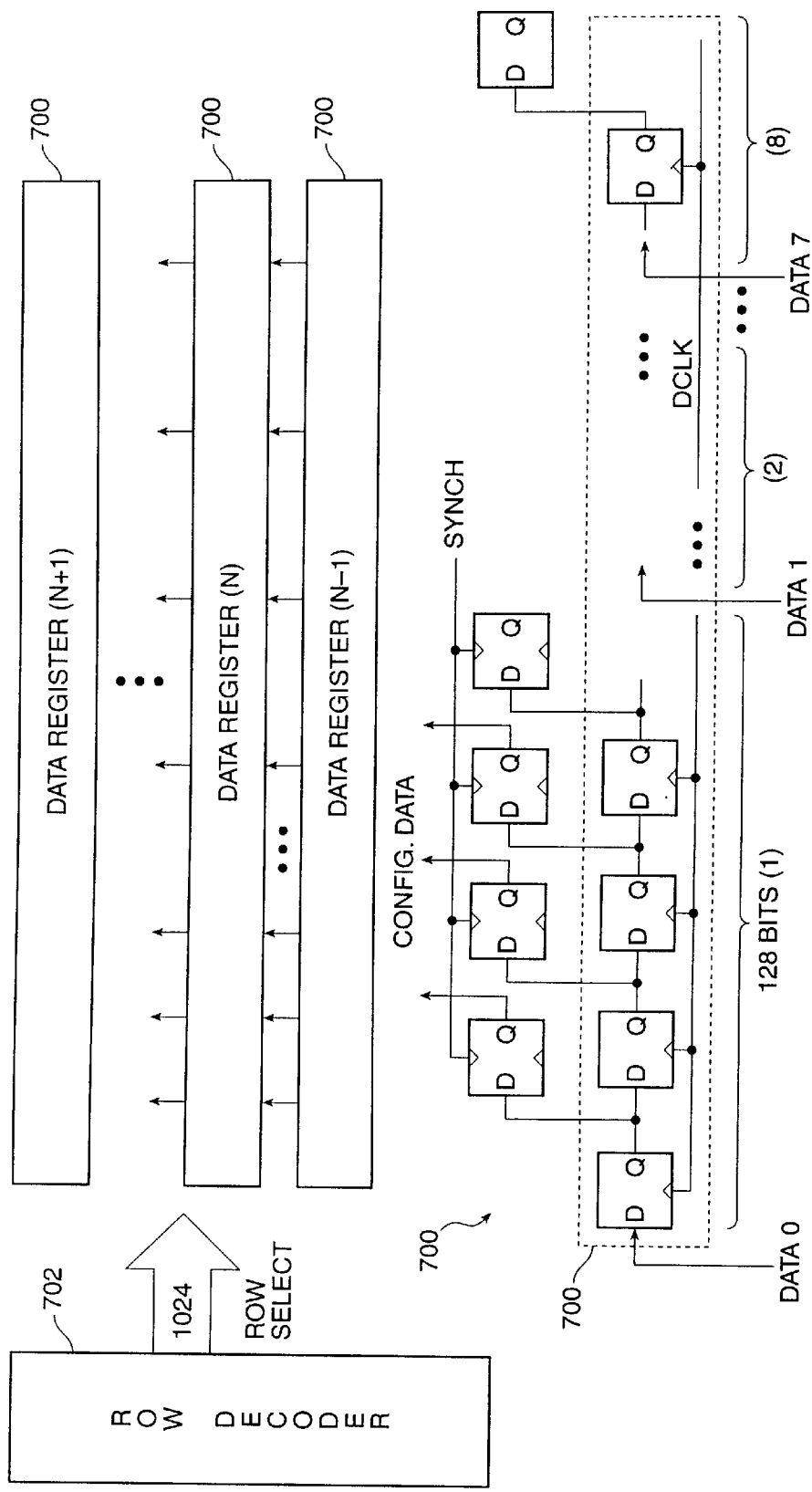
FIG. 7 is an exemplary embodiment for the loading circuitry of the dynamic PLD.

One example of the loading (and refreshing) of the configuration data into the dynamic PLD is described hereinafter in connection with FIG. 7. FIG. 7 shows a portion of the internal circuitry of the dynamic PLD receiving configuration data serially. The loading circuit includes 1024 rows of data registers 700 with each register including eight 128-bit wide shift registers. The configuration data is clocked into the first row of registers 700 and once all 1024 bits (8×128) are loaded, all 1024 bits are shifted into the next row of registers. This process continues until all 1024 rows are loaded with 1 Meg of configuration data. A row decoder 702 selects one of 1024 rows of dynamic configuration cells to be programmed with a selected row of data stored in the selected row of registers.

The only critical timing factor with respect to the refresh operation is maintaining an adequate rate of refresh. An advantage of the present invention is that it allows the refresh cycle to start at any time during the operation of the dynamic PLD without any adverse effects. This is better understood by considering the signal channel properties of the dynamic cell of FIG. 2. Assume first that a logic low charge is stored on the gate terminal of the pass transistor 200 (i.e., at storage node 204). When there is no change in the voltages at the source/drain terminals of transistor 200, there is no impact on the cell conditions at refresh. A minor, self-correcting overcharge in the negative direction, however, occurs when the voltage at source/drain terminals of the pass transistor 200 move from a logic high level (e.g., 5 v) to a low level (e.g., Vss). This is caused by negative charge being coupled to the gate of transistor 200 through its source and drain overlap capacitances. The voltage at node 204, V(204), may under these conditions drop below the logic low level Vss. For a reduced value of n-channel transistor threshold voltage Vtn (due to body effect), as soon as node 204 drops below −Vtn, current flows under the select transistor 202 from the data line to the storage node 204. This limits the negative excursion of V(204) to −Vtn. In the reverse situation, when the voltage at source/drain terminals of transistor 200 move from a logic low level to a logic high level, a small amount of positive charge is coupled to the gate (storage node 204) via the source/drain overlap capacitances. However, given a very large capacitive divide with a large pass transistor 200 and a small select transistor 202, only a small fraction of the drain's potential change couples to node 204. As a result, under these conditions node 204 does not rise much, if at all, above its low level. Thus, when a low charge is stored at the gate of pass transistor 200, not much happens but spurts of ground current via the data lines, and the channels stay off regardless of the signal behavior at the source/drain terminals.

Now assume that the pass transistor 200 stores a high charge at the time of refresh. The source/drain terminals of transistor 200 are tied together by the on channel of the transistor and may both be high or low. Suppose first that the potential V(signal) at source/drain terminals of transistor 200 is low at refresh. The voltage at node 204 would then be increased (refreshed) to the smaller of either the voltage on the data line, V(data), or the voltage on the select line V(select) minus the n-channel threshold voltage Vtn of the select transistor 202. That is, V(204)=min[V(select)−Vtn, V(data)]. If the potential at node 204 is already (i.e., before refresh) greater than the minimum of the above two potentials, then V(data) supplies the new potential if it is less than [V(select)−Vtn], and the storage node 204 will discharge to V(data). It would therefore be desirable to set V(data.high)>[V(select.high)−Vtn]>[V(signal.high)+Vtn] to get optimal results.

When the voltage V(signal) at the source/drain terminals of pass transistor 200 transition from low to high level, positive charge is coupled (via overlap capacitors) to the gate terminal of transistor 200 (i.e., storage node 204). The amount of charge coupled (by a relatively high coupling ratio) is given by ΔV=(coupling-ratio)*[V(signal.high)−V(signal.low)]. If the refresh cycle starts now, given the above signal setting is observed, the potential V(204) at the gate terminal of the pass transistor 200 will not be decreased. As the source/drain terminals of transistor 200 transition from V(signal.high) to V(signal.low), V(204) fluctuates between [V(select.high)−Vtn] and [V(select.high)−Vtn+ΔV].

The above analysis demonstrates that an accurate refresh of the dynamic PLD according to the method of the present invention can be performed at any time during the operation of the PLD. This analysis also suggests that for optimal operation several restrictions should be placed on relative signal levels. For an n-channel implementation of the dynamic cell as in the exemplary embodiment shown in FIG. 2, the following relationships are preferable for optimal operation:

* V(data.high)>[V(select.high)−Vtn]>V(signal.high)+Vtn. This ensures that a full V(signal.high) level is passed across the on channel of pass transistor 200.
* V(signal.low)>V(select.low)−Vtn, and
* V(data.low)>V(select.low)−Vtn.

Both of these settings ensure that select transistor 202 remains completely off when unselected.

If Vss is the lowest available potential, V(data.low) and V(select.low) should preferably be set to Vss, while V(signal.low) should be preferably greater or equal to Vss. The preferred implementation would also ensure that whenever a select signal V(select) goes high, each high level on a storage node 204 is supplied by a voltage on the data line V(data) that is already charged to a potential greater than V(select.high)−Vtn plus some margin.

In conclusion, the present invention provides methods and circuits for refreshing dynamic configuration bits in a dynamic PLD. The present invention makes use of the configuration source to periodically write the configuration data back into the dynamic PLD to refresh the dynamic storage cells. This eliminates the need to perform a sense and read operation for each refresh cycle. Analysis of signal channel properties for the transistors in the dynamic configuration cell of the present invention show that efficient and accurate refresh can be performed without tedious timing requirements. The present invention therefore makes efficient use of the configuration source and provides a lower cost programmable logic device which retains all of the manufacturability, low cost standard wafers and flexibility of SRAM based devices, while gaining the small element size of the EPROM based devices. While the above is a complete description of the preferred embodiments of the present invention, it is possible to use various alternatives, modifications and equivalents. For example, instead of a using a pass transistor as the programmable element, the charge storage node may be an input to a logic gate. Therefore, the scope of the present invention should be determined not with reference to the above description but should, instead, be determined with reference to the appended claims, along with their full scope of equivalents.

What is claimed is:

1. A dynamic programmable logic system comprising:
   a programmable logic device having a plurality of dynamic programmable elements for dynamic storage of configuration data;
   a source memory circuit provided in a separate device external to the programmable logic device, said source memory circuit for storing the configuration data; and
   a controller coupled to the programmable logic device and the source memory circuit, the controller for controlling an interface between the programmable logic device and the source memory circuit;
   wherein, the plurality of dynamic programmable elements inside the programmable logic device are refreshed at a predetermined rate by periodically writing the configuration data from the source memory circuit into the programmable logic device, thereby eliminating a need for sense and read operations is for refresh purposes,
   wherein the interface comprises:
   a data bus coupled between the source memory circuit and the programmable logic device;

a clock interconnect line coupled between the controller and the programmable logic device; and a synch interconnect line coupled between the controller and the programmable logic device to facilitate loading of data into the programmable logic device.

2. The dynamic programmable logic system of claim 1 wherein the synch interconnect line comprises a horizontal synch signal and a vertical synch signal for controlling the loading of configuration data into the programmable logic device.

3. The dynamic programmable logic system of claim 1 wherein the programmable logic device further comprises:

a plurality of data registers coupled to the data bus, synch and clock interconnect lines and configured to serially receive configuration data in response to signals on said synch and clock interconnect lines.

4. The dynamic programmable logic system of claim 1 further comprises:

a second data bus coupled between the controller and the source memory circuit;

an address bus coupled between the controller and the source memory circuit; and a write enable interconnect line coupled between the controller and the source memory circuit.

5. The dynamic programmable logic system of claim 4 further comprising a system interface bus configured to down load configuration data from a data processing unit to the source memory circuit in response to a system clock signal.

6. The dynamic programmable logic system of claim 1 further comprises:

a clock generator coupled to the controller, the clock generator being configured to generate and supply a clock signal to the controller; and a counter coupled to the source memory circuit, the counter being configured to generate and supply address signals to the source memory circuit.

7. The dynamic programmable logic system of claim 6 wherein the source memory circuit, the controller, the clock generator and the counter are all implemented by another programmable logic device.

* * * * *